United States Patent
Choi et al.

(10) Patent No.: US 10,388,401 B2
(45) Date of Patent: Aug. 20, 2019

(54) SEMICONDUCTOR DEVICE, SEMICONDUCTOR SYSTEM, AND METHOD THEREOF

(71) Applicant: SK hynix Inc., Icheon-si Gyeonggi-do (KR)

(72) Inventors: Min Seok Choi, Seoul (KR); Dae Yong Shim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 91 days.

(21) Appl. No.: 15/480,798

(22) Filed: Apr. 6, 2017

(65) Prior Publication Data

US 2018/0074895 A1 Mar. 15, 2018

(30) Foreign Application Priority Data

Sep. 13, 2016 (KR) .......................... 10-2016-0118413

(51) Int. Cl.
*G11C 29/52* (2006.01)
*H03M 13/29* (2006.01)
*G06F 11/10* (2006.01)

(52) U.S. Cl.
CPC .......... *G11C 29/52* (2013.01); *G06F 11/1048* (2013.01); *H03M 13/2906* (2013.01)

(58) Field of Classification Search
None
See application file for complete search history.

(56) References Cited

U.S. PATENT DOCUMENTS

| | | | | |
|---|---|---|---|---|
| 3,814,921 A | * | 6/1974 | Nibby | G06F 11/1056 365/201 |
| 8,874,835 B1 | * | 10/2014 | Davis | G06F 3/0679 711/103 |
| 9,164,834 B2 | * | 10/2015 | Chung | G06F 11/085 |
| 2012/0221916 A1 | | 8/2012 | Schreck et al. | |

FOREIGN PATENT DOCUMENTS

KR 1020140131851 A 11/2014

* cited by examiner

*Primary Examiner* — Steve N Nguyen
(74) *Attorney, Agent, or Firm* — William Park & Associates Ltd.

(57) ABSTRACT

A semiconductor system may be provided. The semiconductor system may include a first semiconductor device configured for outputting a command and an address, and inputting/outputting data. The semiconductor system may include a second semiconductor device including first and second registers, wherein first corrected data, which is generated by correcting an error of internal data outputted in a first error correction operation, may be stored in the first register, and second corrected data, which is generated by correcting an error of the internal data outputted in a second error correction operation, may be stored in the second register, based on the command and the address.

8 Claims, 9 Drawing Sheets

SEMICONDUCTOR DEVICE, SEMICONDUCTOR SYSTEM, AND METHOD THEREOF

CROSS-REFERENCE TO RELATED APPLICATION

The present application claims priority under 35 U.S.C. § 119(a) to Korean Patent Application No. 10-2016-0118413 filed on Sep. 13, 2016 in the Korean Intellectual Property Office, which is incorporated herein by reference in its entirety.

BACKGROUND

1. Technical Field

Embodiments of the present disclosure may generally relate to a semiconductor device and a semiconductor system relating to an error correction operation and method thereof.

2. Related Art

Recently, in order to increase the operating speed of a semiconductor device, DDR2 or DDR3 signaling is used, in which 4-bit or 8-bit data are inputted/outputted in each clock cycle. In the case where an input/output speed of data is increased, the probability of an error to occur during a data transmission process increases. Therefore, a separate device and method for ensuring the reliability of data transmission are additionally demanded.

There is disclosed a method of generating, at each time of transmitting data, error codes capable of checking the occurrence of an error and transmitting the error codes with data, thereby ensuring the reliability of data transmission. The error codes include an error detection code (EDC) capable of detecting an error occurred and an error correction code (ECC) capable of correcting, by itself, an error when it has occurred.

SUMMARY

In an embodiment, a semiconductor system may be provided. The semiconductor system may include a first semiconductor device configured for outputting a command and an address, and inputting/outputting data. The semiconductor system may include a second semiconductor device including first and second registers, wherein first corrected data, which is generated by correcting an error of internal data outputted in a first error correction operation, may be stored in the first register, and second corrected data, which is generated by correcting an error of the internal data outputted in a second error correction operation, may be stored in the second register, based on the command and the address.

In an embodiment, a semiconductor device may be provided. The semiconductor device may include a first bank configured for outputting first internal data and first internal parity and storing the first internal data and the first internal parity, based on a command and an address. The semiconductor device may include a second bank configured for outputting second internal data and second internal parity and storing the second internal data and the second internal parity, based on the command and the address. The semiconductor device may include a data processing circuit configured for generating first corrected data by correcting an error of the first internal data from the first internal parity or generating the first corrected data by correcting an error of the second internal data from the second internal parity in a first error correction operation, and generating second corrected data by correcting an error of the first internal data from the first internal parity or generating the second corrected data by correcting an error of the second internal data from the second internal parity in a second error correction operation.

In an embodiment, a method of operating a semiconductor system may be provided. The method may include outputting a command and an address from a first semiconductor device. The method may include inputting and outputting data to and from the first semiconductor device. The method may include generating first corrected data by correcting an error of internal data outputted in a first error correction operation and storing the first corrected data in a first register within a second semiconductor device. The method may include generating second corrected data by correcting an error of the internal data outputted in a second error correction operation and storing the second corrected data with a second register within the second semiconductor device. The first and second corrected data may be generated based on the command and the address. Wherein the second semiconductor device merges the first corrected data and the data and stores the internal data, based on a masking signal from the first semiconductor device, in the second error correction operation.

DETAILED DESCRIPTION

Hereinafter, a semiconductor device and a semiconductor system will be described below with reference to the accompanying drawings through various examples of embodiments.

Various embodiments may be directed to a semiconductor device and a semiconductor system, which may include separate registers for storing corrected internal data generated by correcting errors of internal data in successive error correction operations and may be capable of correcting an error of internal data and storing corrected internal data in a register while performing an operation of merging another corrected internal data and data.

According to the embodiments, separate registers for storing corrected internal data generated by correcting errors of internal data in successive error correction operations may be provided, and it may be possible to correct an error of internal data and store corrected internal data in a register while performing an operation of merging another corrected internal data and data, whereby data and parity may be inputted and outputted (inputted/outputted) continuously through data lines and parity lines which may be shared.

According to the embodiments, by continuously inputting and outputting (inputting/outputting) data and parity through data lines and parity lines which may be shared, in successive error correction operations, it may be possible to secure the reliability of an error correction operation and a data merging operation.

Figure 1:
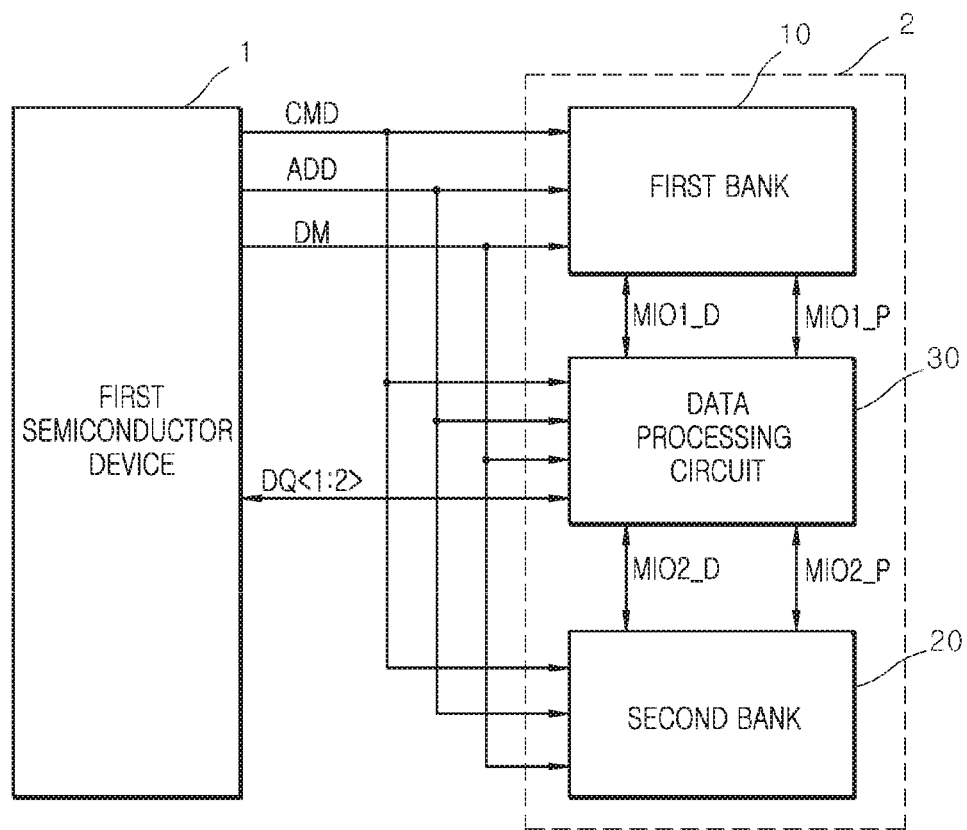
FIG. 1 is a block diagram illustrating a representation of an example of the configuration of a semiconductor system in accordance with an embodiment.

Referring to FIG. 1, a semiconductor system in accordance with an embodiment may include a first semiconductor device 1 and a second semiconductor device 2. The second semiconductor device 2 may include a first bank 10, a second bank 20, and a data processing circuit 30.

The first semiconductor device 1 may output a command CMD, an address ADD and a masking signal DM. The first semiconductor device 1 may input and output (input/output) first data DQ<1> and second data DQ<2>. The command CMD may be outputted through a line through which a command and an address are transmitted, and may be set to include a plurality of bits, according to an embodiment. The address ADD may be outputted through a line through which a command and an address are transmitted, and may be set to include a plurality of bits, according to an embodiment. While each of the first data DQ<1> and the second data DQ<2> is illustrated as one signal, it is to be noted that each of the first data DQ<1> and the second data DQ<2> may be set to include a plurality of bits, according to an embodiment. The first data DQ<1> and the second data DQ<2> may be set as successive data streams. While the masking signal DM is illustrated as one signal, it is to be noted that the masking signal DM may be set to include a plurality of bits, according to an embodiment. The masking signal DM may be set as a signal which includes an information for masking some bits among the plurality of bits included in each of the first data DQ<1> and the second data DQ<2>.

The first bank 10 may input/output first internal data ID<1> (see FIG. 2) through a first data line MIO1_D in response to the command CMD and the address ADD. The first bank 10 may store first and second merged data MD1 and MD2 (see FIG. 6) loaded on the first data line MIO1_D, as the first internal data ID<1>, in response to the command CMD and the address ADD, in a write operation. The first bank 10 may output the first internal data ID<1> through the first data line MIO1_D in a read operation in response to the command CMD and the address ADD. The first bank 10 may input/output first internal parity IP<1> (see FIG. 2) through a first parity line MIO1_P in response to the command CMD and the address ADD. The first bank 10 may store first and second parity P1 and P2 (see FIG. 6) loaded on the first parity line MIO1_P, as the first internal parity IP<1>, in the write operation, in response to the command CMD and the address ADD. The first bank 10 may output the first internal parity IP<1> through the first parity line MIO1_P in the read operation in response to the command CMD and the address ADD. The first internal parity IP<1> may include the failure information of the first internal data ID<1>. The first and second merged data MD1 and MD2 may be set to be the same as the first internal data ID<1>.

The second bank 20 may input/output second internal data (not illustrated) through a second data line MIO2_D in response to the command CMD and the address ADD. The second bank 20 may store first and second merged data MD1 and MD2 (see FIG. 6) loaded on the second data line MIO2_D, as the second internal data, in a write operation, in response to the command CMD and the address ADD. The second bank 20 may output the second internal data through the second data line MIO2_D in a read operation in response to the command CMD and the address ADD. The second bank 20 may input/output second internal parity (not illustrated) through a second parity line MIO2_P in response to the command CMD and the address ADD. The second bank 20 may store first and second parity P1 and P2 (see FIG. 6) loaded on the second parity line MIO2_P, as the second internal parity, in the write operation, in response to the command CMD and the address ADD. The second bank 20 may output the second internal parity through the second parity line MIO2_P, in the read operation, in response to the command CMD and the address ADD. The second internal parity may include the failure information of the second internal data. The first and second merged data MD1 and MD2 may be set to be the same as the second internal data.

Figure 6:
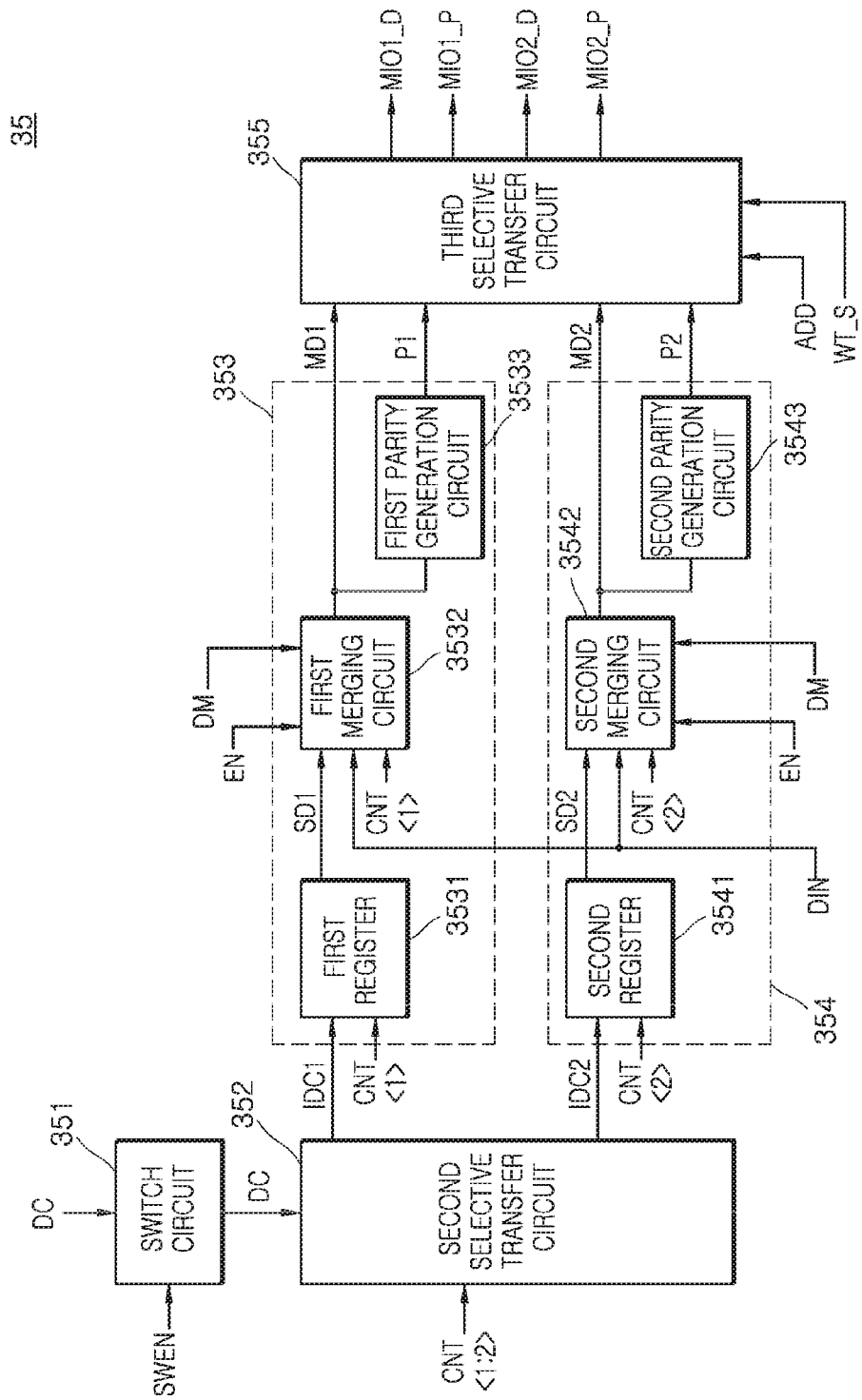
FIG. 6 is a block diagram illustrating a representation of an example of the internal configuration of the data merging circuit included in the data processing circuit illustrated in FIG. 4.

The data processing circuit 30 may correct an error of the first internal data ID<1> from the first internal parity IP<1> in a first error correction operation for the first bank 10, and generate first corrected data IDC1 (see FIG. 6). The data processing circuit 30 may merge the first corrected data IDC1 and the first data DQ<1> in a second error correction operation for the first bank 10, and generate the first merged data MD1. The data processing circuit 30 may correct an error of the first internal data ID<1> from the first internal parity IP<1> in the second error correction operation for the first bank 10, and generate second corrected data IDC2 (see FIG. 6). Each of the first error correction operation and the second error correction operation is set in such a manner that a read operation and a write operation are performed successively. The first error correction operation and the second error correction operation mean error correction operations that are performed sequentially. The first corrected data IDC1 is generated from corrected data DC (see FIG. 4) which is generated in the first error correction operation for the first bank 10. The second corrected data IDC2 is generated from corrected data DC which is generated in the second error correction operation for the first bank 10. The data processing circuit 30 may generate the first and second parity P1 and P2 which include error information on the first and second merged data MD1 and MD2 in the first error correction operation and the second error correction operation for the first bank 10.

The data processing circuit 30 may correct an error of the second internal data from the second internal parity in a first error correction operation for the second bank 20, and generate first corrected data IDC1 (see FIG. 6). The data processing circuit 30 may merge the first corrected data IDC1 and the second data DQ<2> in a second error correction operation for the second bank 20, and generate the first merged data MD1. The data processing circuit 30 may correct an error of the second internal data from the second internal parity in the second error correction operation for the second bank 20, and generate second corrected data IDC2 (see FIG. 6). The first corrected data IDC1 is generated from corrected data DC (see FIG. 4) which is generated in the first error correction operation for the second bank 20. The second corrected data IDC2 is generated from corrected data DC which is generated in the second error correction operation for the second bank 20. The data processing circuit 30 may generate the first and second parity P1 and P2 which include error information on the first and second merged data MD1 and MD2 in the first error correction operation and the second error correction operation for the second bank 20.

The second semiconductor device 2 in accordance with an embodiment, configured as mentioned above, may store the first corrected data IDC1 generated by correcting an error of the outputted first internal data ID<1> in the first error correction operation in response to the command CMD and the address ADD, in a first register 3531 (see FIG. 6). The second semiconductor device 2 may store the second corrected data IDC2 generated by correcting an error of the outputted first internal data ID<1> in the second error correction operation in response to the command CMD and the address ADD, in a second register 3541 (see FIG. 6).

Figure 2:
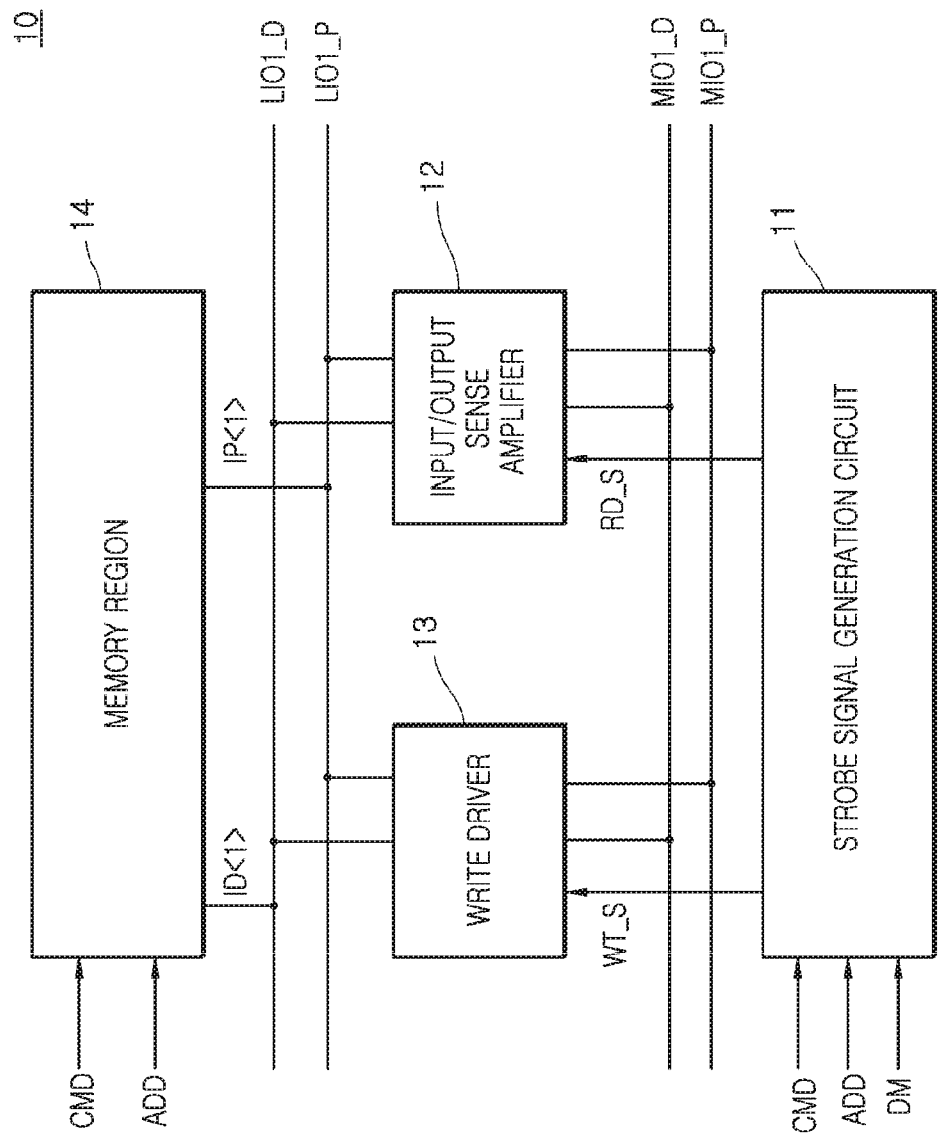
FIG. 2 is a block diagram illustrating a representation of an example of the internal configuration of the first bank included in the semiconductor system illustrated in FIG. 1.

Referring to FIG. 2, the first bank 10 in accordance with an embodiment may include a strobe signal generation circuit 11, an input/output sense amplifier 12, a write driver 13, and a memory region 14.

The strobe signal generation circuit 11 may generate a read strobe signal RD_S and a write strobe signal WT_S which are sequentially enabled in the first and second error correction operations, in response to the command CMD, the address ADD and the masking signal DM.

The input/output sense amplifier 12 may output the first internal data ID<1> loaded on a first local data line LIO1_D, to the first data line MIO1_D, in response to the read strobe signal RD_S. The input/output sense amplifier 12 may output the first internal parity IP<1> loaded on a first local parity line LIO1_P, to the first parity line MIO1_P, in response to the read strobe signal RD_S.

The write driver 13 may output the first and second merged data MD1 and MD2 loaded on the first data line MIO1_D, to the first local data line LIO1_D, in response to the write strobe signal WT_S. The write driver 13 may output the first and second parity P1 and P2 loaded on the first parity line MIO1_P, to the first local parity line LIO1_P, in response to the write strobe signal WT_S.

The memory region 14 may output the first internal data ID<1> to the first local data line LIO1_D in a read operation in response to the command CMD and the address ADD. The memory region 14 may output the first internal parity IP<1> to the first local parity line LIO1_P in the read operation in response to the command CMD and the address ADD. The memory region 14 may store the first and second merged data MD1 and MD2 loaded on the first local data line LIO1_D, as the first internal data ID<1>, in a write operation, in response to the command CMD and the address ADD. The memory region 14 may store the first and second parity P1 and P2 loaded on the first local parity line LIO1_P, as the first internal parity IP<1>, in the write operation, in response to the command CMD and the address ADD.

Since the second bank 20 is realized to have the same configuration and perform the same operation as the first bank 10 illustrated in FIG. 2, detailed descriptions thereof will be omitted herein.

Figure 3:
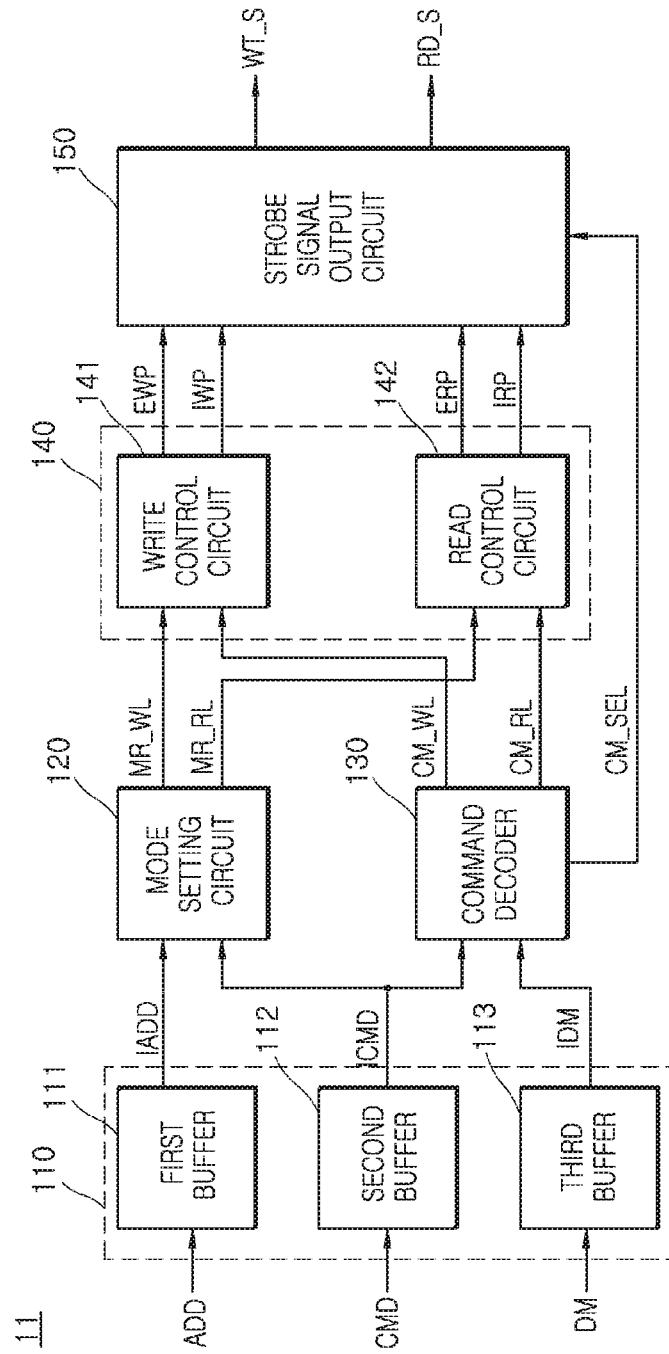
FIG. 3 is a block diagram illustrating a representation of an example of the internal configuration of the strobe signal generation circuit included in the first bank illustrated in FIG. 2.

Referring to FIG. 3, the strobe signal generation circuit 11 in accordance with an embodiment may include a buffer circuit 110, a mode setting circuit 120, a command decoder 130, a control circuit 140, and a strobe signal output circuit 150.

The buffer circuit 110 may include a first buffer 111, a second buffer 112, and a third buffer 113. The first buffer 111 may buffer the address ADD and generate an internal address IADD. The second buffer 112 may buffer the command CMD and generate an internal command ICMD. The third buffer 113 may buffer the masking signal DM and generate an internal masking signal IDM.

The mode setting circuit 120 may generate a mode write signal MR_WL and a mode read signal MR_RL with a delay amount set by the internal address IADD, in response to the internal command ICMD. The mode setting circuit 120 may generate the mode write signal MR_WL in the case where the internal command ICMD is a combination for entering a write operation. The mode setting circuit 120 may generate the mode read signal MR_RL in the case where the internal command ICMD is a combination for entering a read operation. The mode setting circuit 120 may generate the mode write signal MR_WL and the mode read signal MR_RL, by being set with the delay amount by a delay amount information inputted through the internal address IADD. The delay amount set in the mode setting circuit 120 may be set variously by the first semiconductor device 1. The mode write signal MR_WL may be set a signal which is enabled in a write operation for storing the first and second data DQ<1:2> applied from the first semiconductor device 1. The mode read signal MR_RL may be set as a signal which is enabled in a read operation for outputting the first and second internal data ID<1:2> stored.

The command decoder 130 may decode the internal command ICMD and generate a command write signal CM_WL and a command read signal CM_RL, in response to the internal masking signal IDM. The command decoder 130 may generate a command select signal CM_SEL which is enabled in response to the internal masking signal IDM. The command decoder 130 may decode the internal command ICMD in the case where the internal masking signal IDM is inputted, and generate the command read signal CM_RL and the command write signal CM_WL which are sequentially enabled. The command decoder 130 may generate the command write signal CM_WL after generating the command read signal CM_RL, in the case where the internal masking signal IDM is inputted.

The control circuit 140 may include a write control circuit 141 and a read control circuit 142. The write control circuit 141 may generate a first write pulse EWP which includes a pulse generated in response to the mode write signal MR_WL. The write control circuit 141 may generate a second write pulse IWP which includes a pulse generated in response to the command write signal CM_WL. The read control circuit 142 may generate a first read pulse ERP which includes a pulse generated in response to the mode read signal MR_RL. The read control circuit 142 may generate a second read pulse IRP which includes a pulse generated in response to the command read signal CM_RL.

The strobe signal output circuit 150 may output any one of the first write pulse EWP and the second write pulse IWP as the write strobe signal WT_S in response to the command select signal CM_SEL. The strobe signal output circuit 150 may output the first write pulse EWP as the write strobe signal WT_S in the case where the command select signal CM_SEL is disabled. The strobe signal output circuit 150 may output the second write pulse IWP as the write strobe signal WT_S in the case where the command select signal CM_SEL is enabled. The strobe signal output circuit 150 may output any one of the first read pulse ERP and the second read pulse IRP as the read strobe signal RD_S in response to the command select signal CM_SEL. The strobe signal output circuit 150 may output the first read pulse ERP as the read strobe signal RD_S in the case where the command select signal CM_SEL is disabled. The strobe signal output circuit 150 may output the second read pulse IRP as the read strobe signal RD_S in the case where the command select signal CM_SEL is enabled.

Figure 4:
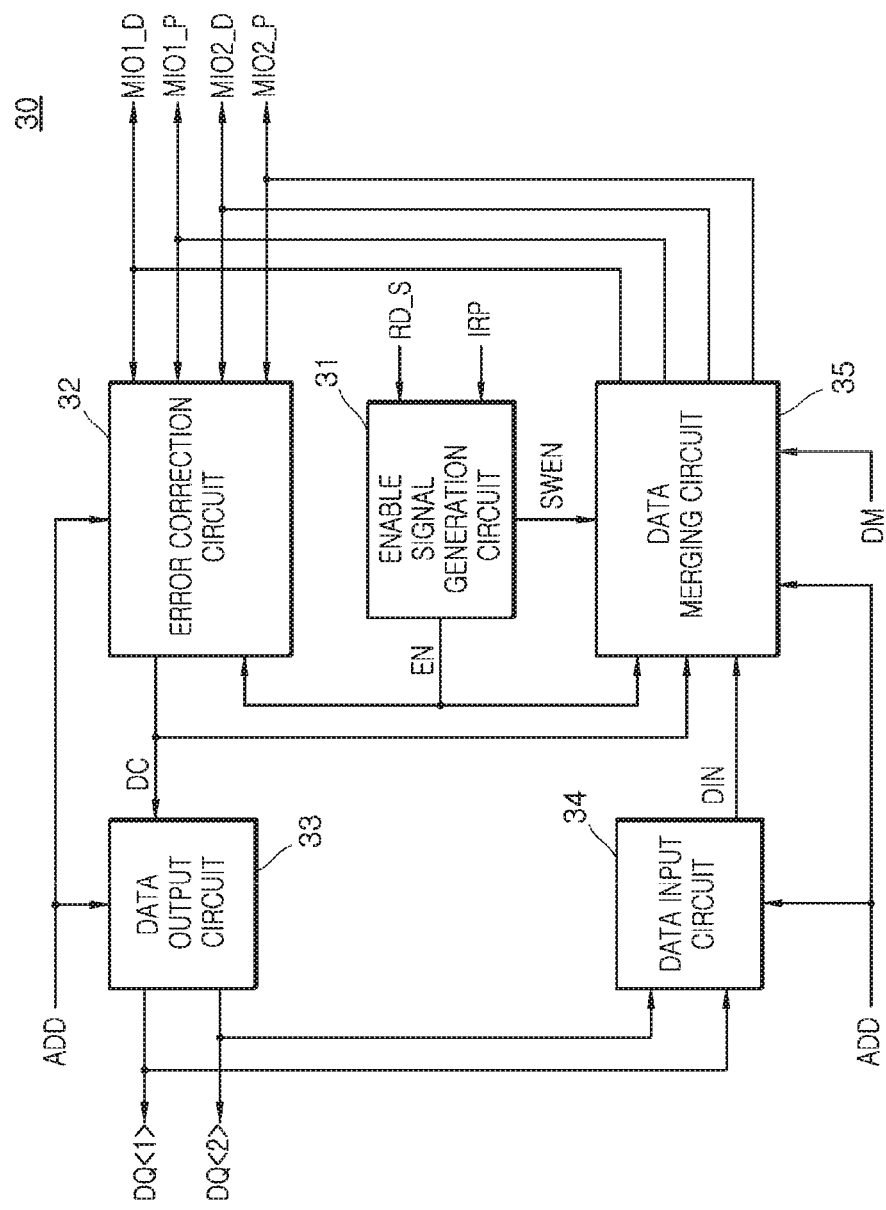
FIG. 4 is a block diagram illustrating a representation of an example of the internal configuration of the data processing circuit included in the semiconductor system illustrated in FIG. 1.

Referring to FIG. 4, the data processing circuit 30 in accordance with an embodiment may include an enable signal generation circuit 31, an error correction circuit 32, a data output circuit 33, a data input circuit 34, and a data merging circuit 35.

The enable signal generation circuit 31 may generate an enable signal EN and a switching enable signal SWEN which are enabled in response to the read strobe signal RD_S and the second read pulse IRP generated in the first bank 10. The enable signal generation circuit 31 may generate the enable signal EN which is enabled in the case where the pulse of the read strobe signal RD_S generated in the first bank 10 is inputted. The enable signal generation circuit 31 may generate the switching enable signal SWEN which is enabled in the case where the pulse of the second read pulse IRP generated in the first bank 10 is inputted. The enable signal generation circuit 31 may generate the enable signal EN and the switching enable signal SWEN which are enabled in response to the read strobe signal RD_S and the second read pulse IRP generated in the second bank 20. The enable signal generation circuit 31 may generate the enable signal EN which is enabled in the case where the pulse of the read strobe signal RD_S generated in the second bank 20 is inputted. The enable signal generation circuit 31 may generate the switching enable signal SWEN which is enabled in the case where the pulse of the second read pulse IRP generated in the second bank 20 is inputted.

The error correction circuit 32 may correct an error of the first internal data ID<1> from the first internal parity IP<1> and output the corrected data DC, in response to the enable signal EN. The error correction circuit 32 may correct an error of the first internal data ID<1> loaded on the first data line MIO1_D, from the first internal parity IP<1> loaded on the first parity line MIO1_P selected according to the address ADD, and output the corrected data DC, in response to the enable signal EN. The error correction circuit 32 may correct an error of the first internal data ID<1> loaded on the first data line MIO1_D, from the first internal parity IP<1> loaded on the first parity line MIO1_P, in the case where the address ADD is a combination for selecting the first bank 10, and output the corrected data DC, in response to the enable signal EN. The error correction circuit 32 may correct an error of the second internal data from the second internal parity and output the corrected data DC, in response to the enable signal EN. The error correction circuit 32 may correct an error of the second internal data loaded on the second data line MIO2_D, from the second internal parity loaded on the second parity line MIO2_P selected according to the address ADD, and output the corrected data DC, in response to the enable signal EN. The error correction circuit 32 may correct an error of the second internal data loaded on the second data line MIO2_D, from the second internal parity loaded on the second parity line MIO2_P, in the case where the address ADD is a combination for selecting the second bank 20, and output the corrected data DC, in response to the enable signal EN.

The data output circuit 33 may output the corrected data DC as the first and second data DQ<1:2> in response to the address ADD. The data output circuit 33 may output the corrected data DC as the first data DQ<1> in the case where the address ADD is the combination for selecting the first bank 10. The data output circuit 33 may output the corrected data DC as the second data DQ<2> in the case where the address ADD is the combination for selecting the second bank 20.

The data input circuit 34 may be inputted with the first and second data DQ<1:2> and generate input data DIN, in response to the address ADD. The data input circuit 34 may be inputted with the first data DQ<1> and generate the input data DIN, in the case where the address ADD is the combination for selecting the first bank 10. The data input circuit 34 may transfer the first data DQ<1> as the input data DIN in the case where the address ADD is the combination for selecting the first bank 10. The data input circuit 34 may be inputted with the second data DQ<2> and generate the input data DIN, in the case where the address ADD is the combination for selecting the second bank 20. The data input circuit 34 may transfer the second data DQ<2> as the input data DIN in the case where the address ADD is the combination for selecting the second bank 20.

The data merging circuit 35 may be inputted with the corrected data DC in response to the switching enable signal SWEN. The data merging circuit 35 may merge the corrected data DC and the input data DIN and generate the first and second merged data MD1 and MD2 and the first and second parity P1 and P2, in response to the address ADD and the masking signal DM. The data merging circuit 35 may merge the corrected data DC and the input data DIN and generate the first merged data MD1 and the first parity P1, in response to the masking signal DM in the first error correction operation. The data merging circuit 35 may merge the corrected data DC and the input data DIN and generate the second merged data MD2 and the second parity P2, in response to the masking signal DM in the second error correction operation. The data merging circuit 35 may output the first and second merged data MD1 and MD2 to the first data line MIO1_D in the case where the address ADD is the combination for selecting the first bank 10. The data merging circuit 35 may output the first and second parity P1 and P2 to the first parity line MIO1_P in the case where the address ADD is the combination for selecting the first bank 10. The data merging circuit 35 may output the first and second merged data MD1 and MD2 to the second data line MIO2_D in the case where the address ADD is the combination for selecting the second bank 20. The data merging circuit 35 may output the first and second parity P1 and P2 to the second parity line MIO2_P in the case where the address ADD is the combination for selecting the second bank 20.

Figure 5:
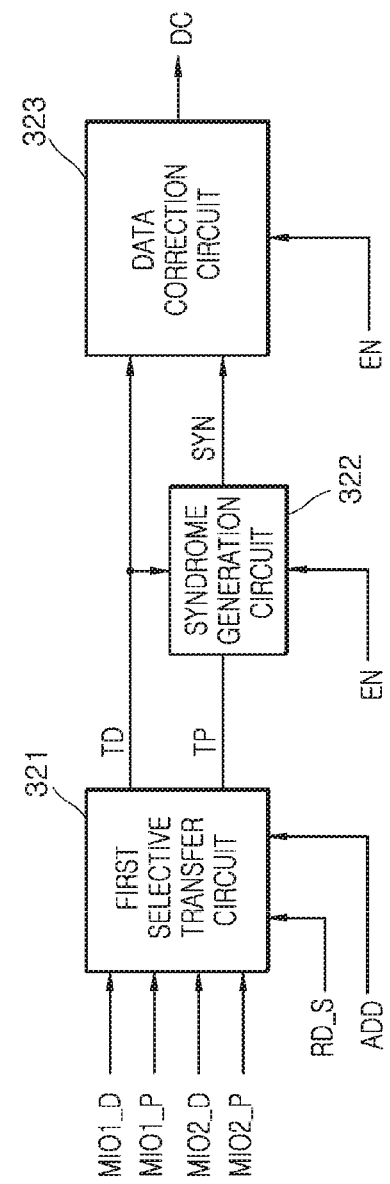
FIG. 5 is a block diagram illustrating a representation of an example of the internal configuration of the error correction circuit included in the data processing circuit illustrated in FIG. 4.

Referring to FIG. 5, the error correction circuit 32 in accordance with an embodiment may include a first selective transfer circuit 321, a syndrome generation circuit 322, and a data correction circuit 323.

The first selective transfer circuit 321 may transfer the first internal data ID<1> loaded on the first data line MIO1_D, as transfer data TD, in response to the read strobe signal RD_S and the address ADD. The first selective transfer circuit 321 may transfer the first internal data ID<1> loaded on the first data line MIO1_D, as the transfer data TD, in the case where the address ADD is the combination for selecting the first bank 10, in response to the read strobe signal RD_S. The first selective transfer circuit 321 may transfer the first internal parity IP<1> loaded on the first parity line MIO1_P, as transfer parity TP, in response to the read strobe signal RD_S and the address ADD. The first selective transfer circuit 321 may transfer the first internal parity IP<1> loaded on the first parity line MIO1_P, as the transfer parity TP, in the case where the address ADD is the combination for selecting the first bank 10, in response to the read strobe signal RD_S. The first selective transfer circuit 321 may transfer the second internal data loaded on the second data line MIO2_D, as the transfer data TD, in response to the read strobe signal RD_S and the address ADD. The first selective transfer circuit 321 may transfer the second internal data loaded on the second data line MIO2_D, as the transfer data TD, in the case where the address ADD is the combination for selecting the second bank 20, in response to the read strobe signal RD_S. The first selective transfer circuit 321 may transfer the second internal parity loaded on the second parity line MIO2_P, as the transfer parity TP, in response to the read strobe signal RD_S and the address ADD. The first selective transfer circuit 321 may transfer the second internal parity loaded on the second parity line MIO2_P, as the transfer parity TP, in the case where the address ADD is the combination for selecting the second bank 20, in response to the read strobe signal RD_S.

The syndrome generation circuit 322 may generate a syndrome SYN including the error bit information of the transfer data TD, from the transfer parity TP, in response to the enable signal EN. The syndrome generation circuit 322 may be inputted with the transfer data TD and the transfer parity TP and generate the syndrome SYN including the error bit information of the transfer data TD. The syndrome SYN may be generated by employing an error correction code (ECC) scheme. The syndrome SYN may be generated to include a plurality of bits capable of including information on an error bit included in the transfer data TD.

The data correction circuit 323 may correct the error bit of the transfer data TD from the syndrome SYN and generate the corrected data DC, in response to the enable signal EN. The data correction circuit 323 may output the transfer data TD as the corrected data DC in the case where no error occurs in the transfer data TD.

Referring to FIG. 6, the data merging circuit 35 in accordance with an embodiment may include a switch circuit 351, a second selective transfer circuit 352, a first merged data generation circuit 353, a second merged data generation circuit 354, and a third selective transfer circuit 355.

The switch circuit 351 may transfer the corrected data DC in response to the switching enable signal SWEN. The switch circuit 351 may transfer the corrected data DC in the case where the switching enable signal SWEN is enabled. The switch circuit 351 may block input of the corrected data DC in the case where the switching enable signal SWEN is disabled.

The second selective transfer circuit 352 may transfer the corrected data DC as the first and second corrected data IDC1 and IDC2 in response to first and second counting signals CNT<1:2>. The second selective transfer circuit 352 may transfer the corrected data DC as the first corrected data IDC1 and then transfer the corrected data DC as the second corrected data IDC2 in response to the first and second counting signals CNT<1:2>. The second selective transfer circuit 352 may transfer the corrected data DC as the first corrected data IDC1 in the first error correction operation. The second selective transfer circuit 352 may transfer the corrected data DC as the second corrected data IDC2 in the second error correction operation. The first counting signal CNT<1> may be enabled in the first error correction operation. The second counting signal CNT<2> may be enabled in the second error correction operation.

The first merged data generation circuit 353 may include the first register 3531, a first merging circuit 3532, and a first parity generation circuit 3533.

The first register 3531 may store the first corrected data IDC1 in response to the first counting signal CNT<1>. The first register 3531 may output the stored first corrected data IDC1 as first storage data SD1 in response to the first counting signal CNT<1>. The first register 3531 may store the first corrected data IDC1 in the first error correction operation. The first register 3531 may output the stored first corrected data IDC1 as the first storage data SD1 in the first error correction operation.

The first merging circuit 3532 may merge the first storage data SD1 and some bits of the input data DIN and generate the first merged data MD1, according to the masking signal DM in response to the enable signal EN and the first counting signal CNT<1>. The first merging circuit 3532 may merge the first storage data SD1 and some bits of the input data DIN and generate the first merged data MD1, according to the masking signal DM in the first error correction operation.

The first parity generation circuit 3533 may generate the first parity P1 which includes the error information of the first merged data MD1. The first parity generation circuit 3533 may generate the first parity P1 by performing a logic calculation selectively on the bits included in the first merged data MD1. The first parity P1 may be generated by employing an error correction code (ECC) scheme.

For example, the operation of generating the first merged data MD1 by merging the first storage data SD1 and some bits of the input data DIN according to the masking signal DM, by taking, as an example, the case where each of the first storage data SD1<1:8>, the input data DIN<1:8> and the first merged data MD1<1:8> includes 8 bits. Before making descriptions, it may be assumed that the masking signal DM<1:8> is realized by, for example but not limited to, 8 bits and is generated to mask the bits of the input data DIN<1:8> corresponding to a second bit DM<2>, a fourth bit DM<4> and an eighth bit DM<8>.

In the first merging circuit 3532, according to the masking signal DM<1:8>, a first bit MD1<1> of the first merged data MD1<1:8> is generated from a first bit DIN<1> of the input data DIN<1:8>, a second bit MD1<2> of the first merged data MD1<1:8> is generated from a second bit SD1<2> of the first storage data SD1<1:8>, a third bit MD1<3> of the first merged data MD1<1:8> is generated from a third bit DIN<3> of the input data DIN<1:8>, a fourth bit MD1<4> of the first merged data MD1<1:8> is generated from a fourth bit SD1<4> of the first storage data SD1<1:8>, a fifth bit MD1<5> of the first merged data MD1<1:8> is generated from a fifth bit DIN<5> of the input data DIN<1:8>, a sixth bit MD1<6> of the first merged data MD1<1:8> is generated from a sixth bit DIN<6> of the input data DIN<1:8>, a seventh bit MD1<7> of the first merged data MD1<1:8> is generated from a seventh bit DIN<7> of the input data DIN<1:8>, and an eighth bit MD1<8> of the first merged data MD1<1:8> is generated from an eighth bit SD1<8> of the first storage data SD1<1:8>.

In this way, the first merged data MD1<1:8> corresponding to the second bit DM<2>, the fourth bit DM<4> and the eighth bit DM<8> of the masking signal DM<1:8> are generated from the first storage data SD1<1:8>. The first merged data MD1<1:8> corresponding to a first bit DM<1>, a third bit DM<3>, a fifth bit DM<5>, a sixth bit DM<6> and a seventh bit DM<7> of the masking signal DM<1:8> are generated from the input data DIN<1:8>.

The second merged data generation circuit 354 may include the second register 3541, a second merging circuit 3542, and a second parity generation circuit 3543.

The second register 3541 may store the second corrected data IDC2 in response to the second counting signal CNT<2>. The second register 3541 may output the stored second corrected data IDC2 as second storage data SD2 in response to the second counting signal CNT<2>. The second register 3541 may store the second corrected data IDC2 in the second error correction operation. The second register 3541 may output the stored second corrected data IDC2 as the second storage data SD2 in the second error correction operation.

The second merging circuit 3542 may merge the second storage data SD2 and some bits of the input data DIN and generate the second merged data MD2, according to the masking signal DM in response to the enable signal EN and the second counting signal CNT<2>. The second merging circuit 3542 may merge the second storage data SD2 and some bits of the input data DIN and generate the second merged data MD2, according to the masking signal DM in the second error correction operation.

The second parity generation circuit 3543 may generate the second parity P2 which includes the error information of the second merged data MD2. The second parity generation circuit 3543 may generate the second parity P2 by performing a logic calculation selectively on the bits included in the second merged data MD2. The second parity P2 may be generated by employing the error correction code (ECC) scheme.

The operation of generating the second merged data MD2 in the second merging circuit 3542 is substantially the same as the operation of generating the first merged data MD1 in the first merging circuit 3532, detailed descriptions thereof will be omitted herein.

The third selective transfer circuit 355 may transfer the first and second merged data MD1 and MD2 to the first data line MIO1_D or the second data line MIO2_D in response to the write strobe signal WT_S and the address ADD. The third selective transfer circuit 355 may transfer the first and second merged data MD1 and MD2 to the first data line MIO1_D in the case where the address ADD is the combination for selecting the first bank 10, in response to the write strobe signal WT_S. The third selective transfer circuit 355 may transfer the first and second merged data MD1 and MD2 to the second data line MIO2_D in the case where the address ADD is the combination for selecting the second bank 20, in response to the write strobe signal WT_S. The third selective transfer circuit 355 may transfer the first and second parity P1 and P2 to the first parity line MIO1_P or the second parity line MIO2_P in response to the write strobe signal WT_S and the address ADD. The third selective transfer circuit 355 may transfer the first and second parity P1 and P2 to the first parity line MIO1_P in the case where the address ADD is the combination for selecting the first bank 10, in response to the write strobe signal WT_S. The third selective transfer circuit 355 may transfer the first and second parity P1 and P2 to the second parity line MIO2_P in the case where the address ADD is the combination for selecting the second bank 20, in response to the write strobe signal WT_S.

The operation of the semiconductor system in accordance with an embodiment will be described below with reference to FIG. 7, by taking an example that the first error correction operation and the second error correction operation for the first bank 10 are continuously performed.

At a time T1, the first semiconductor device 1 outputs the command CMD, the address ADD, the masking signal DM and the first data DQ<1>. The command CMD is outputted as a combination for an error correction operation. The address ADD is outputted as a combination for selecting the first bank 10 (BK1). The masking signal DM is outputted to include information for masking some bits included in the first data DQ<1>.

The memory region 14 of the first bank 10 outputs the first internal data ID<1> to the first local data line LIO1_D in response to the command CMD and the address ADD. The memory region 14 outputs the first internal parity IP<1> to the first local parity line LIO1_P in response to the command CMD and the address ADD.

At a time T2, the strobe signal generation circuit 11 of the first bank 10 generates the read strobe signal RD_S which is enabled in a first error correction operation, in response to the command CMD, the address ADD and the masking signal DM.

At a time T3, the input/output sense amplifier 12 of the first bank 10 outputs the first internal data ID<1> loaded on the first local data line LIO1_D, to the first data line MIO1_D, in response to the read strobe signal RD_S. The input/output sense amplifier 12 outputs the first internal parity IP<1> loaded on the first local parity line LIO1_P, to the first parity line MIO1_P, in response to the read strobe signal RD_S.

At a time T4, the enable signal generation circuit 31 of the data processing circuit 30 generates the enable signal EN of a logic high level and the switching enable signal SWEN of a logic high level in response to the read strobe signal RD_S and the second read pulse IRP.

At a time T5, the error correction circuit 32 of the data processing circuit 30 corrects an error of the first internal data ID<1> from the first internal parity IP<1> and outputs the corrected data DC, in response to the enable signal EN. The data input circuit 34 is inputted with the first data DQ<1> and generates the input data DIN, in response to the address ADD. The data merging circuit 35 is inputted with the corrected data DC in response to the switching enable signal SWEN. The data merging circuit 35 merges the corrected data DC and the input data DIN and generates the first merged data MD1 and the first parity P1, in response to the address ADD and the masking signal DM.

At a time T6, the first semiconductor device 1 outputs the command CMD, the address ADD, the masking signal DM and the first data DQ<1>. The command CMD is outputted as a combination for an error correction operation. The address ADD is outputted as a combination for selecting the first bank 10. The masking signal DM is outputted to include information for masking some bits included in the first data DQ<1>.

The memory region 14 of the first bank 10 outputs the first internal data ID<1> to the first local data line LIO1_D in response to the command CMD and the address ADD. The memory region 14 outputs the first internal parity IP<1> to the first local parity line LIO1_P in response to the command CMD and the address ADD.

At a time T7, the strobe signal generation circuit 11 of the first bank 10 generates the read strobe signal RD_S which is enabled in a second error correction operation, in response to the command CMD, the address ADD and the masking signal DM.

At a time T8, the input/output sense amplifier 12 of the first bank 10 outputs the first internal data ID<1> loaded on the first local data line LIO1_D, to the first data line MIO1_D, in response to the read strobe signal RD_S. The input/output sense amplifier 12 outputs the first internal parity IP<1> loaded on the first local parity line LIO1_P, to the first parity line MIO1_P, in response to the read strobe signal RD_S.

At a time T9, the enable signal generation circuit 31 of the data processing circuit 30 generates the enable signal EN of the logic high level and the switching enable signal SWEN of the logic high level in response to the read strobe signal RD_S and the second read pulse IRP.

At a time T10, the error correction circuit 32 of the data processing circuit 30 corrects an error of the first internal data ID<1> from the first internal parity IP<1> and outputs the corrected data DC, in response to the enable signal EN. The data input circuit 34 is inputted with the first data DQ<1> and generates the input data DIN, in response to the address ADD. The data merging circuit 35 is inputted with the corrected data DC in response to the switching enable signal SWEN. The data merging circuit 35 merges the corrected data DC and the input data DIN and generates the second merged data MD2 and the second parity P2, in response to the address ADD and the masking signal DM.

At a time T11, the first semiconductor device 1 outputs the command CMD, the address ADD, the masking signal DM and the first data DQ<1>. The command CMD is outputted as a combination for an error correction operation. The address ADD is outputted as a combination for selecting the first bank 10. The masking signal DM is outputted to include information for masking some bits included in the first data DQ<1>.

At a time T12, the strobe signal generation circuit 11 of the first bank 10 generates the write strobe signal WT_S which is enabled in a first error correction operation, in response to the command CMD, the address ADD and the masking signal DM.

At a time T13, the data merging circuit 35 of the data processing circuit 30 outputs the first merged data MD1 to the first data line MIO1_D in response to the address ADD and the write strobe signal WT_S. The data merging circuit 35 outputs the first parity P1 to the first parity line MIO1_P in response to the address ADD and the write strobe signal WT_S. The write driver 13 of the first bank 10 outputs the first merged data MD1 loaded on the first data line MIO1_D, to the first local data line LIO1_D, in response to the write strobe signal WT_S. The write driver 13 outputs the first parity P1 loaded on the first parity line MIO1_P, to the first local parity line LIO1_P, in response to the write strobe signal WT_S. The memory region 14 stores the first merged data MD1 loaded on the first local data line LIO1_D, as the first internal data ID<1>, in response to the command CMD and the address ADD. The memory region 14 stores the first parity P1 loaded on the first local parity line LIO1_P, as the first internal parity IP<1>, in response to the command CMD and the address ADD.

At a time T14, the first semiconductor device 1 outputs the command CMD, the address ADD, the masking signal DM and the first data DQ<1>. The command CMD is outputted as a combination for an error correction operation. The address ADD is outputted as a combination for selecting the first bank 10. The masking signal DM is outputted to include information for masking some bits included in the first data DQ<1>.

At a time T15, the strobe signal generation circuit 11 of the first bank 10 generates the write strobe signal WT_S which is enabled in a second error correction operation, in response to the command CMD, the address ADD and the masking signal DM.

At a time T16, the data merging circuit 35 of the data processing circuit 30 outputs the second merged data MD2 to the first data line MIO1_D in response to the address ADD and the write strobe signal WT_S. The data merging circuit 35 outputs the second parity P2 to the first parity line MIO1_P in response to the address ADD and the write strobe signal WT_S. The write driver 13 of the first bank 10 outputs the second merged data MD2 loaded on the first data line MIO1_D, to the first local data line LIO1_D, in response to the write strobe signal WT_S. The write driver 13 outputs the second parity P2 loaded on the first parity line MIO1_P, to the first local parity line LIO1_P, in response to the write strobe signal WT_S. The memory region 14 stores the second merged data MD2 loaded on the first local data line LIO1_D, as the first internal data ID<1>, in response to the command CMD and the address ADD. The memory region 14 stores the second parity P2 loaded on the first local parity line LIO1_P, as the first internal parity IP<1>, in response to the command CMD and the address ADD.

Figure 7:
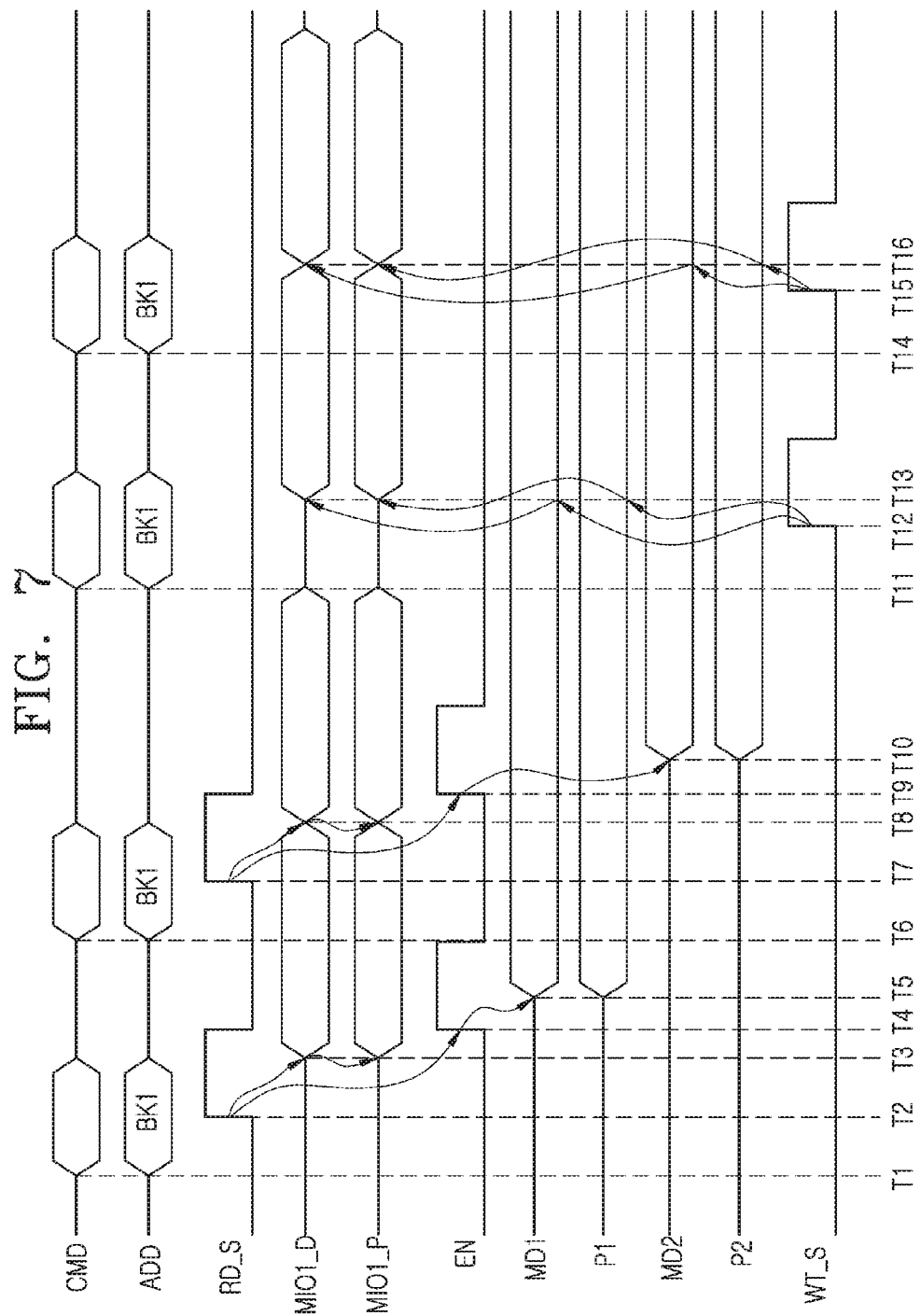
FIG. 7 is a representation of an example of a timing diagram to assist in the explanation of the operation of the semiconductor system in accordance with an embodiment.

An operation of outputting the first internal data ID<1> to the first data line MIO1_D and an operation of outputting the first internal parity IP<1> to the first parity line MIO1_P in response to the read strobe signal RD_S generated according to the command CMD inputted at the time T11 of FIG. 7 may be performed in the same manner as the operations from the time T1 to the time T5. Such a read operation may be performed after the time T16.

Also, an operation of outputting the first internal data ID<1> to the first data line MIO1_D and an operation of outputting the first internal parity IP<1> to the first parity line MIO1_P in response to the read strobe signal RD_S generated according to the command CMD inputted at the time T14 of FIG. 7 may be performed in the same manner as the operations from the time T6 to the time T10. Such a read operation may be performed after the time T16.

Accordingly, it is possible to prevent collision of the first internal data ID<1> loaded on the first data line MIO1_D in a read operation and the first merged data MD1 loaded on the first data line MIO1_D in a write operation.

As is apparent from the above descriptions, in a semiconductor system in accordance with an embodiment, advantages may be provided in that separate registers for storing corrected internal data generated by correcting errors of internal data in successive error correction operations are provided, and it may be possible to correct an error of internal data and store corrected internal data in a register while performing an operation of merging another corrected internal data and data, whereby data and parity may be inputted/outputted continuously through data lines and parity lines which are shared. In a semiconductor system in accordance with an embodiment, advantages may be provided in that, by inputting/outputting continuously data and parity through data lines and parity lines which are shared, in successive error correction operations, it may be possible to secure the reliability of an error correction operation and a data merging operation.

Figure 8:
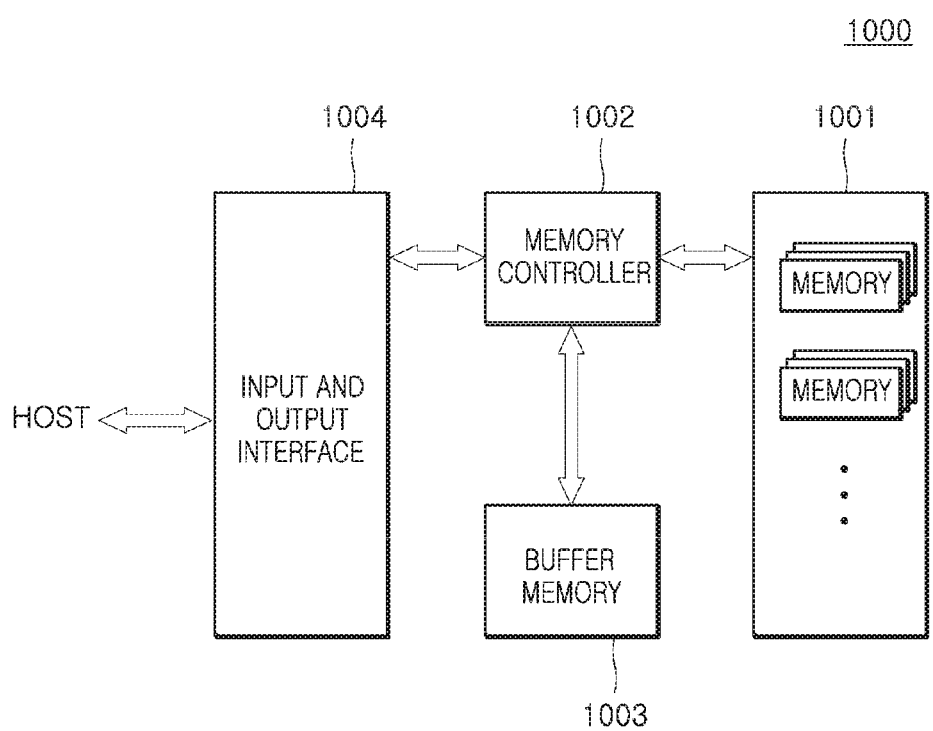
FIG. 8 is a diagram illustrating a representation of an example of the configuration of an electronic system to which the semiconductor devices and the semiconductor system illustrated in FIGS. 1 to 7 may be applied.

The semiconductor devices described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input and output (input/output) interface 1004.

The data storage 1001 stores data applied from the memory controller 1002, and reads out stored data and outputs the read-out data to the memory controller 1002, according to control signals from the memory controller 1002. The data storage 1001 may include the second semiconductor devices 2 illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor devices 1 illustrated in FIG. 1. While the memory controller 1002 is illustrated as one block in FIG. 8, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MC), an embedded MMC (eMC), or a compact flash (CF) card.

Figure 9:
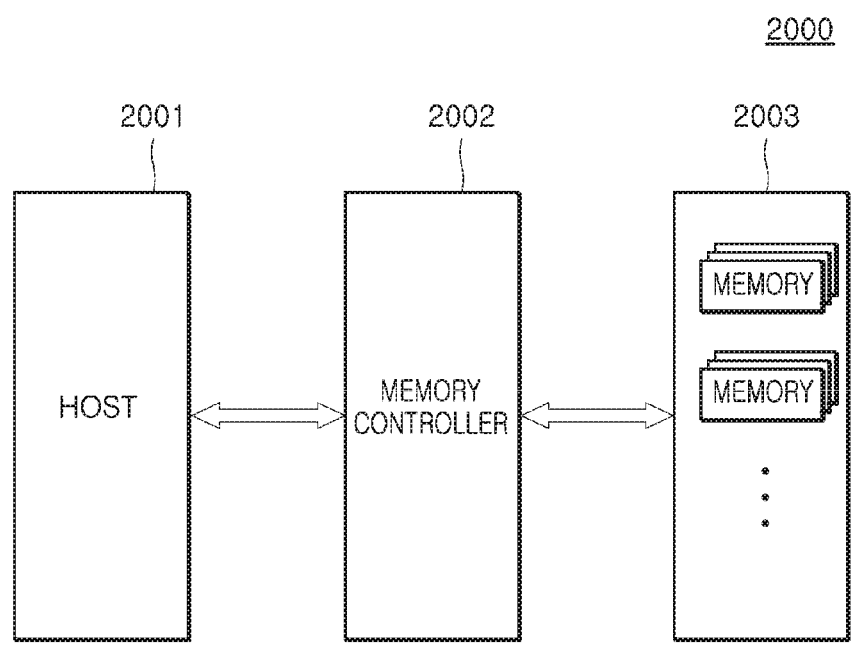
FIG. 9 is a diagram illustrating a representation of an example of the configuration of an electronic system to which the semiconductor device and the semiconductor system illustrated in FIGS. 1 to 7 may be applied.

Referring to FIG. 9, an electronic system 2000 in accordance with an embodiment may include a host 2001, a memory controller 2002, and a data storage 2003.

The host 2001 may transmit a request and data to the memory controller 2002 to access the data storage 2003. The memory controller 2002 may provide data, a data strobe, a command, an address and a clock to the data storage 2003 in response to the request, and in response to this, the data storage 2003 may perform a write or read operation. The host 2001 may transmit data to the memory controller 2002 to store the data in the data storage 2003. Also, the host 2001 may receive, through the memory controller 2002, the data outputted from the data storage 2003. The host 2001 may include a circuit which corrects an error included in data, by using an error correction code (ECC) scheme.

The memory controller 2002 may relay communication between the host 2001 and the data storage 2003. The memory controller 2002 may receive a request and data from the host 2002. In order to control the operation of the data storage 2003, the memory controller 2002 may generate data, a data strobe, a command, an address and a clock, and provide them to the data storage 2003. The memory controller 2002 may provide the data outputted from the data storage 2003, to the host 2001.

The data storage 2003 may include a plurality of memories. The data storage 2003 may receive data, a data strobe, a command, an address and a clock from the memory controller 2002, and perform a write or read operation. Each of the plurality of memories included in the data storage 2003 may include a circuit which corrects an error included in data, by using the error correction code (ECC) scheme.

The error correction circuit included in the host 2001 and the error correction circuits included in the plurality of memories in the data storage 2003 may be realized to operate all together or operate selectively, according to embodiments. The host 2001 and the memory controller 2002 may be realized by the same chip according to an embodiment. The memory controller 2002 and the data storage 2003 may be realized by the same chip according to an embodiment.

While various embodiments have been described above, it will be understood to those skilled in the art that the embodiments described are by way of example only. Accordingly, the semiconductor devices and the semiconductor systems described herein should not be limited based on the described embodiments.

What is claimed is:

1. A semiconductor device comprising:
a first bank configured for outputting first internal data and first internal parity and storing the first internal data and the first internal parity, based on a command and an address;
a second bank configured for outputting second internal data and second internal parity and storing the second internal data and the second internal parity, based on the command and the address; and
a data processing circuit configured for generating first corrected data by correcting an error of the first internal data from the first internal parity or generating the first corrected data by correcting an error of the second internal data from the second internal parity in a first error correction operation, and generating second corrected data by correcting an error of the first internal data from the first internal parity or generating the second corrected data by correcting an error of the second internal data from the second internal parity in a second error correction operation,
wherein the data processing circuit merges the first corrected data and input data based on a masking signal in the second error correction operation, and
wherein, the data is inputted from an external device.

2. The semiconductor device according to claim 1, wherein the first bank comprises:
a first strobe signal generation circuit configured for generating a first read strobe signal and a first write strobe signal which are sequentially enabled in the first and second error correction operations, based on the command, the address and the masking signal;

a first input and output (input/output) sense amplifier configured for outputting the first internal data loaded on a first local data line, to a first data line, and outputting the first internal parity loaded on a first local parity line, to a first parity line, based on the first read strobe signal;

a first write driver configured for outputting first merged data loaded on the first data line, to the first local data line, and outputting first parity loaded on the first parity line, to the first local parity line, based on the first write strobe signal; and a first memory region configured for outputting the first internal data to the first local data line and outputting the first internal parity to the first local parity line, in a read operation, based on the command and the address, and storing the first merged data loaded on the first local data line, as the first internal data, and storing the first parity loaded on the first local parity line, as the first internal parity, in a write operation, based on the command and the address.

3. The semiconductor device according to claim 1, wherein the second bank comprises:
a second strobe signal generation circuit configured for generating a second read strobe signal and a second write strobe signal which are sequentially enabled in the first and second error correction operations, based on the command, the address and the masking signal;

a second input and output (input/output) sense amplifier configured for outputting the second internal data loaded on a second local data line, to a second data line, and outputting the second internal parity loaded on a second local parity line, to a second parity line, based on the second read strobe signal;

a second write driver configured for outputting second merged data loaded on the second data line, to the second local data line, and outputting second parity loaded on the second parity line, to the second local parity line, based on the second write strobe signal; and a second memory region configured for outputting the second internal data to the second local data line and outputting the second internal parity to the second local parity line, in a read operation, based on the command and the address, and storing the second merged data loaded on the second local data line, as the second internal data, and storing the second parity loaded on the second local parity line, as the second internal parity, in a write operation, based on the command and the address.

4. The semiconductor device according to claim 1, wherein the data processing circuit comprises:
an enable signal generation circuit configured for generating an enable signal and a switching enable signal which are enabled based on first and second read strobe signals and first and second read pulses;

an error correction circuit configured for outputting corrected data by correcting the error of the internal data from the internal parity or outputting corrected data by correcting the error of the second internal data from the second internal parity, based on the enable signal;

a data output circuit configured for outputting the corrected data as first data or second data based on the address;

a data input circuit configured for being inputted with the first data or the second data and generating input data based on the address; and a data merging circuit configured for being inputted with the corrected data based on the switching enable signal, and merging the corrected data and the input data and outputting the first merged data and the first parity or the second merged data and the second parity based on the address and the masking signal.

5. The semiconductor device according to claim 4, wherein the error correction circuit comprises:
a first selective transfer circuit configured for transferring the first internal data and the first internal parity loaded on the first data line and the first parity line as transfer data and transfer parity or transferring the second internal data and the second internal parity loaded on the second data line and the second parity line as the transfer data and the transfer parity, based on the read strobe signal and the address;

a syndrome generation circuit configured for generating a syndrome which includes an information on an error bit of the transfer data, from the transfer parity, based on the enable signal; and a data correction circuit configured for correcting the error bit of the transfer data from the syndrome and generating the corrected data, based on the enable signal.

6. The semiconductor device according to claim 4, wherein the data merging circuit comprises:
a switch circuit configured for transferring the corrected data based on the switching enable signal;

a second selective transfer circuit configured for transferring the corrected data as the second corrected data after transferring the corrected data as the first corrected data, based on first and second counting signals;

a first merged data generation circuit configured for generating first merged data by merging the first corrected data and the input data according to the masking signal, and generating first parity from the first merged data, based on the first counting signal;

a second merged data generation circuit configured for generating second merged data by merging the second corrected data and the input data according to the masking signal, and generating second parity from the second merged data, based on the second counting signal; and a third selective transfer circuit configured for transferring the first and second merged data to the first data line or transferring the first and second merged data to the second data line, and transferring the first and second parity to the first parity line or transferring the first and second parity to the second parity line, based on a write strobe signal and the address.

7. The semiconductor device according to claim 6, wherein the first merged data generation circuit comprises:
the first register configured for storing the first corrected data and outputting the first corrected data as first storage data, based on the first counting signal;

a first merging circuit configured for merging the first storage data and some bits of the input data and generating the first merged data, according to the masking signal based on the enable signal and the first counting signal; and a first parity generation circuit configured for generating the first parity which includes an error information of the first merged data.

8. The semiconductor device according to claim 6, wherein the second merged data generation circuit comprises:
- the second register configured for storing the second corrected data and outputting the second corrected data as second storage data, based on the second counting signal;
- a second merging circuit configured for merging the second storage data and some bits of the input data and generating the second merged data, according to the masking signal based on the enable signal and the second counting signal; and
- a second parity generation circuit configured for generating the second parity which includes an error information of the second merged data.

* * * * *